(12) United States Patent
Pan et al.

(10) Patent No.: US 6,642,138 B2
(45) Date of Patent: Nov. 4, 2003

(54) PROCESS OF MAKING DUAL DAMASCENE STRUCTURES USING A SACRIFICIAL POLYMER

(75) Inventors: Wei Pan, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/112,439

(22) Filed: Mar. 29, 2002

(65) Prior Publication Data

US 2003/0064581 A1 Apr. 3, 2003

Related U.S. Application Data

(63) Continuation-in-part of application No. 09/967,594, filed on Sep. 28, 2001, now Pat. No. 6,555,467.

(51) Int. Cl.[7] .......................................... H01L 21/8234
(52) U.S. Cl. ...................................................... 438/619
(58) Field of Search ................................ 438/618, 671, 438/717, 780, 942, 945, 619, 622

(56) References Cited

U.S. PATENT DOCUMENTS

| | | | | |
|---|---|---|---|---|
| 5,821,169 A | * | 10/1998 | Nguyen et al. | 438/736 |
| 6,051,866 A | * | 4/2000 | Shaw et al. | 257/417 |
| 6,413,852 B1 | * | 7/2002 | Grill et al. | 438/619 |
| 6,448,176 B1 | * | 9/2002 | Grill et al. | 438/637 |
| 2002/0187629 A1 | * | 12/2002 | Huang et al. | 438/624 |
| 2003/0008490 A1 | * | 1/2003 | Xing et al. | 438/622 |

OTHER PUBLICATIONS

Article entitled, "NURA: A Feasible, Gas Dielectric Interconnect Process", by M. B. Anand et al., published in VLSI Symposium, Technical Digest, pp. 82–83, 1996.
Article entitled, "Use of Gas as Low–k Interlayer Dielectric in LSI's: Demonstration of Feasibility", M. B. Anand et al., published in IEEE ED–44, #11, pp. 1965–1971, 1997.
Article entitled, "Air–Gaps in 0.3 μm Electrical Interconnections" by Paul A. Kohl et al., published in IEEE EDL–21, pp 557–559, 2000.
Manufacture's datasheet entitled, "Unity Sacrificial Polymer—Processing Overview", by BFGoodrich, 6 pages.

* cited by examiner

*Primary Examiner*—David Nelms
*Assistant Examiner*—Quoc Hoang
(74) *Attorney, Agent, or Firm*—Matthew D. Rabdau; David C. Ripma; Scott C. Krieger

(57) ABSTRACT

A method is provided to deposit and pattern a sacrificial polymer, and form metal layers. A double hard mask is used to pattern and etch the sacrificial polymer. The double hard mask may be formed at temperatures below 400° C. The sacrificial polymer is capable of being decomposed to become air gaps during annealing.

18 Claims, 4 Drawing Sheets

PROCESS OF MAKING DUAL DAMASCENE STRUCTURES USING A SACRIFICIAL POLYMER

CROSS-REFERENCES

This application is a continuation-in-part of U.S. patent application Ser. No. 09/967,594, filed Sep. 28, 2001 U.S. Pat. No. 6,555,467, entitled Air Gaps Copper Interconnect, which is incorporated herein by reference.

BACKGROUND OF THE INVENTION

This invention relates to inter-level isolation of interconnects in semiconductor devices and more particularly to integration processes for producing very low-k isolation of copper interconnects.

Copper interconnects are formed using a dual damascene process. The incorporation of low-k insulator material may be accomplished by depositing a first layer of low-k dielectric material over a copper interconnect. This may be followed by an optional etch stop barrier insulator and then a second layer of low-k material. A via is then etched through the second layer of low-k material, any etch stop barrier insulator, and the first layer of low-k dielectric material to reach the copper interconnect. A trench is then etched into the second layer of low-k material to aid in forming another layer of copper interconnects. Barrier metal and copper are deposited by sputtering, chemical vapor deposition (CVD), electrochemical deposition, or a combination of these methods. The deposited copper, and possibly the barrier metal, will then be planarized using chemical mechanical polishing (CMP) to form copper interconnects.

Air gaps have been used for intra-level insulators for copper, while using silicon oxide at the inter-level copper layers. The air gaps are formed by decomposing Unity™ sacrificial polymer. However, copper is in direct contact with oxide, which may result in copper diffusion into the oxide causing leakage current flow between adjacent copper lines.

SUMMARY OF THE INVENTION

Accordingly, a method of fabricating copper interconnects to integrate air gaps as inter-level insulator or intra-level and inter-level insulators is provided. A method is provided to deposit and pattern a sacrificial polymer, and form metal layers. The sacrificial polymer is capable of being decomposed to become air gaps during annealing. One possible candidate for use as a sacrificial polymer is a copolymer of butylnorbornene and triethoxysilyl norbornene dissolved as a 6–12 wt % solution in mesitylene.

A double hard mask, which comprises a first hard mask and a second hard mask, may be used to pattern the sacrificial polymer. The first hard mask may be a metal film, such as AlCu, Ti, Ta, TiN or TaN. The second hard mask may be silicon dioxide.

DETAILED DESCRIPTION OF THE INVENTION

Figure 1:
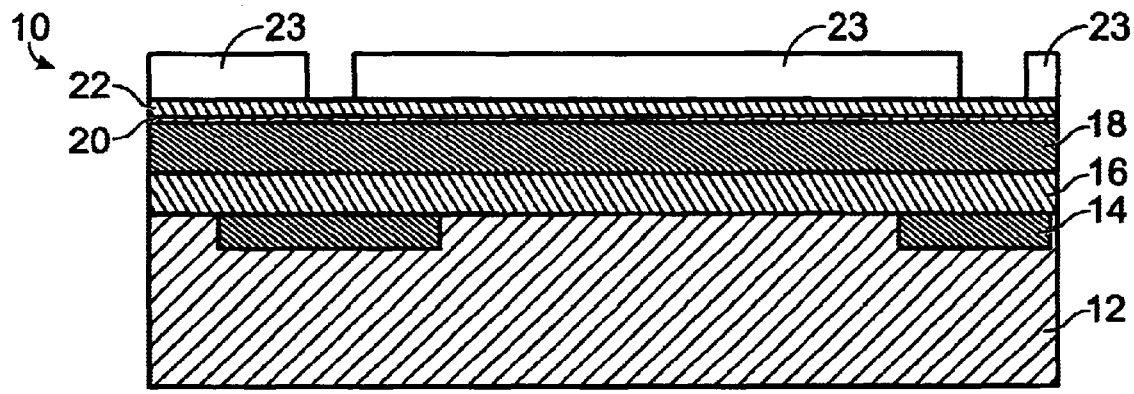
FIG. 1 is a cross sectional view of an interconnect structure during a masking step.

FIG. 1 shows an interconnect structure 10 comprising a substrate 12 with device regions 14 following front-end fabrication. In one embodiment, which is illustrate in the attached figures, oxide is used as a first insulator 16 between the substrate 12 and metal lines to be formed overlying the first insulator. In another embodiment, another low-k material could be used instead of oxide, or Unity™ sacrificial polymer could be used.

After front-end fabrication is complete the first insulator layer 16, which is preferrably silicon dioxide, between approximately 500 nm and 1000 nm thick, is deposited over the substrate and CMP planarized to form the dielectric layer between the substrate 12 and a first metal line, which is yet to be formed. A first sacrificial layer 18 is spin coated to a thickness of approximately between 500 nm to 800 nm. In one embodiment, the first sacrificial layer 18 comprises Unity™ sacrificial polymer. The Unity™ sacrificial polymer is available from B F Goodrich, Cleveland, Ohio. It is a copolymer of butylnorbornene and triethoxysilyl norbornene. The Unity™ sacrificial polymer was dissolved as a 6–12 wt % solution in mesitylene for spin coating application. If the first sacrificial layer 18 is Unity™ sacrificial polymer, it is preferably soft baked at between approximately 95° C. and 120° C. for approximately three to five minutes. The soft bake is followed by a curing process. The Unity™ sacrificial polymer is preferably cured under vacuum or nitrogen ambient at between approximately 200° C. and 250° C. for approximately one to two hours.

A first hard mask 20, preferably between approximately 50 nm and 100 nm, is deposited followed by the deposition of a second hard mask 22 to form a double hard mask atop the first sacrificial layer 18 for self-aligned via formation. The first hard mask is a metal film, such as AlCu, Ti, Ta, TaN or TiN, or silicon dioxide. The second hard mask is silicon dioxide or a metal film such as AlCu, Ti, Ta, TaN or TiN. Each hard mask is preferably able to be selectively etched without etching the other hard mask. For example, if the first hard mask is a metal film, TiN, then the second hard mask could be silicon dioxide, or vice versa. The two hard masks may be formed using temperatures below 400° C. For example, TiN could be deposited by sputtering at a temperature of approximately 300° C. Silicon dioxide could be used by depositing low temperature TEOS at a temperature of approximately 250° C.

Figure 2:
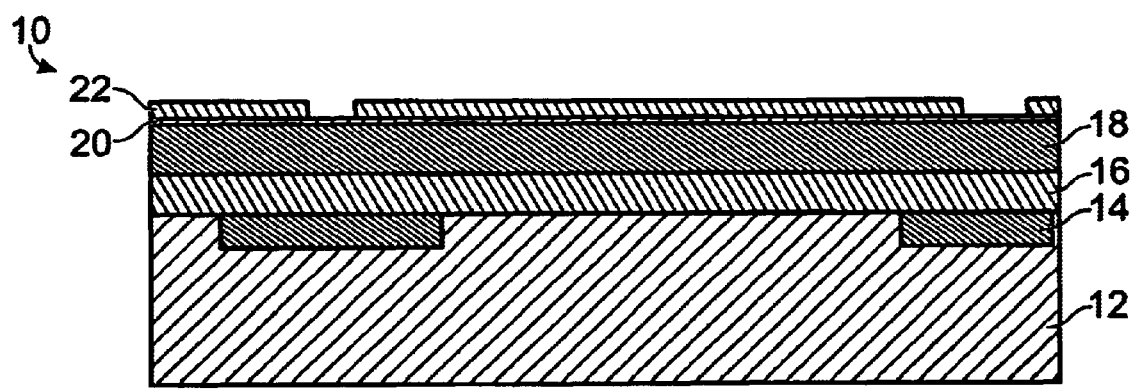
FIG. 2 is a cross sectional view of the interconnect structure following etching of a second hard mask.

A first layer of photoresist 23 is deposited over the second hard mask 22 and patterned. The second hard mask is etched to form a via opening in the second hard mask, as shown in FIG. 2. For ease of description, a single via opening is discussed although a plurality of via openings may be formed simultaneously, as shown in the attached figures. For example, if the second hard mask is a silicon dioxide mask, the via opening could be etched using $C_2F_6/O_2$ plasma etch, or other suitable etch.

Figure 3:
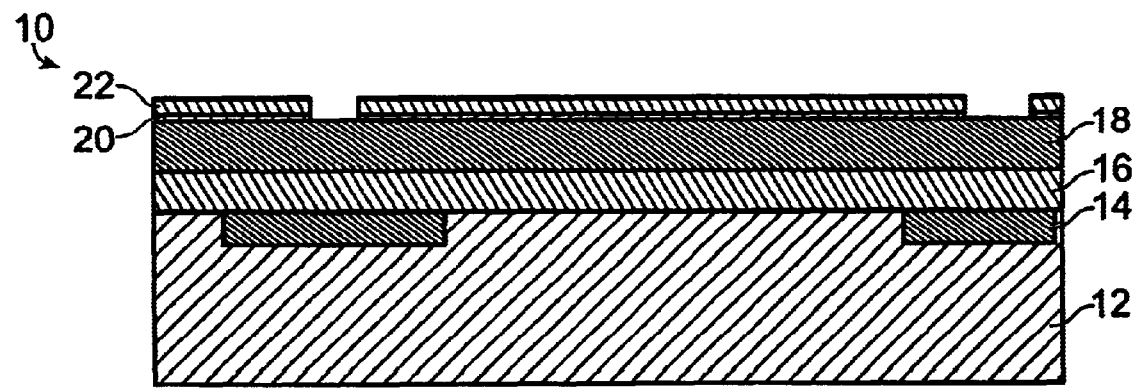
FIG. 3 is a cross sectional view following formation of a partial via through the second hard mask and a first hard mask.

Referring now to FIG. 3, a via is etched into the first hard mask using the second hard mask. For example, if the second hard mask is TiN, a standard $Cl_2/BCl_3$ plasma etch, or other suitable selective etch, could be used. The via now extends through both the first and second hard masks.

Figure 4:
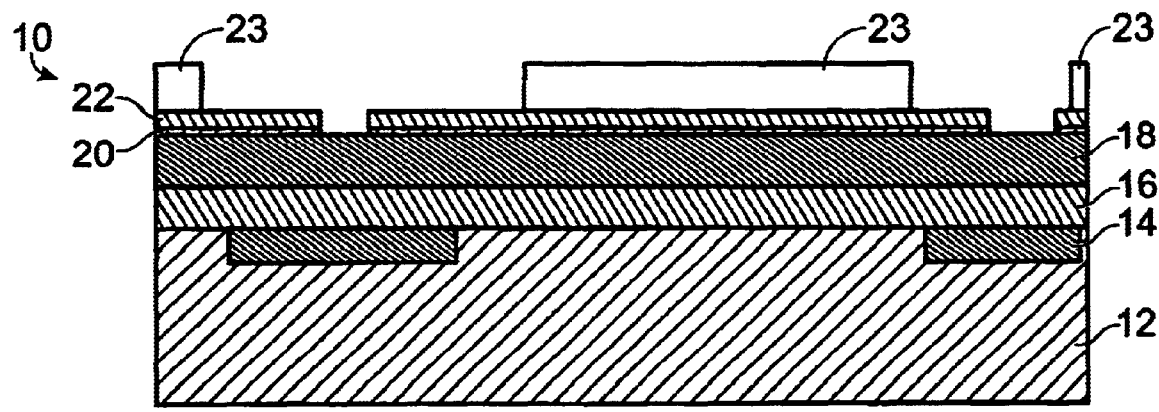
FIG. 4 is a cross sectional view of the interconnect structure during a masking step.
Figure 5:
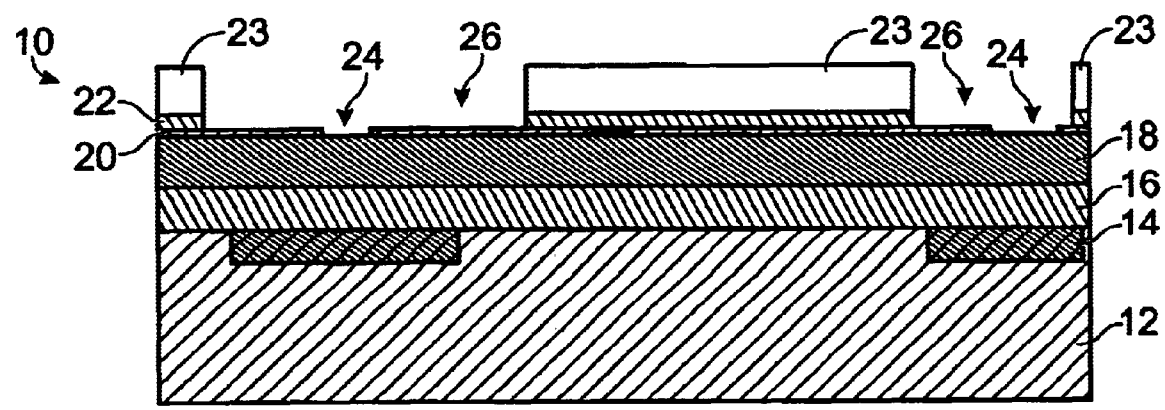
FIG. 5 is a cross sectional view following formation of a line in the second hard mask.

Referring now to FIG. 4, a second layer of photoresist 25 is deposited and patterned to form a line mask. The second hard mask is then etched to form a line opening 26, as shown in FIG. 5.

Figure 6:
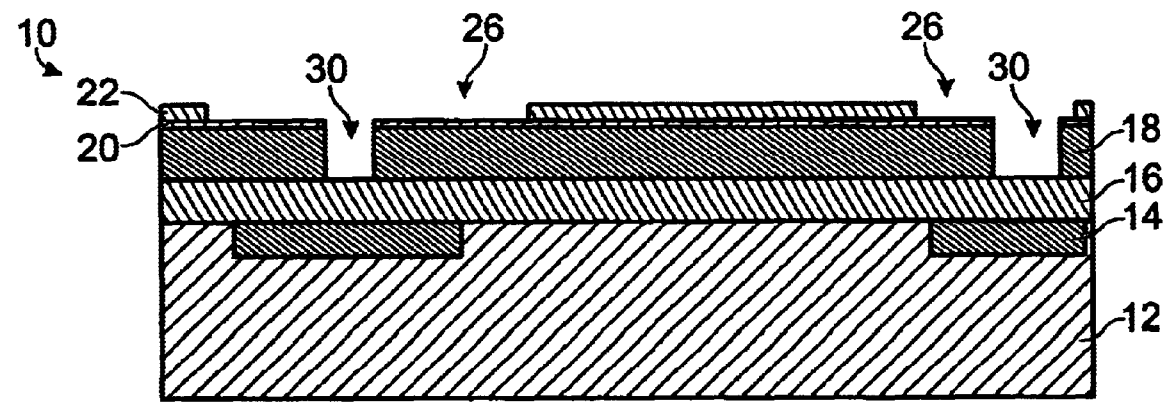
FIG. 6 is a cross sectional view following etching of a via in a sacrificial layer.

Referring now to FIG. 6, the first sacrificial layer 18 is etched to form a via 30 where the first sacrificial layer 18 is not protected by either the second hard mask 22 or first hard mask 20. The method of etching the first sacrificial layer 18 will depend upon the material chosen for the first sacrificial layer. If Unity™ sacrificial polymer is used for the first sacrificial layer it can be etched using a dry etch process, for example an oxygen plasma etch, such as an $Ar/O_2$ plasma etch, or other suitable etch process.

Figure 7:
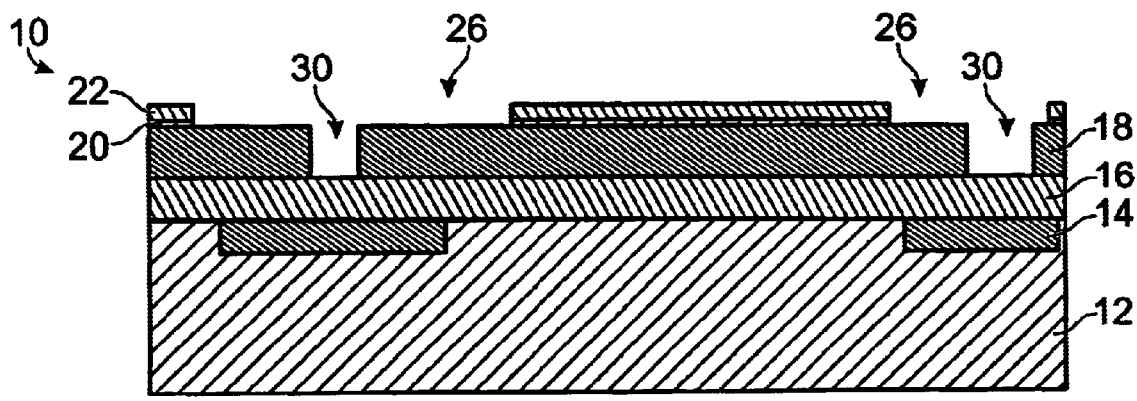
FIG. 7 is a cross sectional view following formation of a line in the first hard mask.

Referring now to FIG. 7, in one embodiment, the first hard mask 20 is selectively etched using the second hard mask 22 to form the line pattern in the first hard mask. In one embodiment, the second hard mask is removed after the first hard mask 20 has been etched. Alternatively, the second hard mask 22 could be left intact, and removed during subsequent etch processes, as shown.

Figure 8:
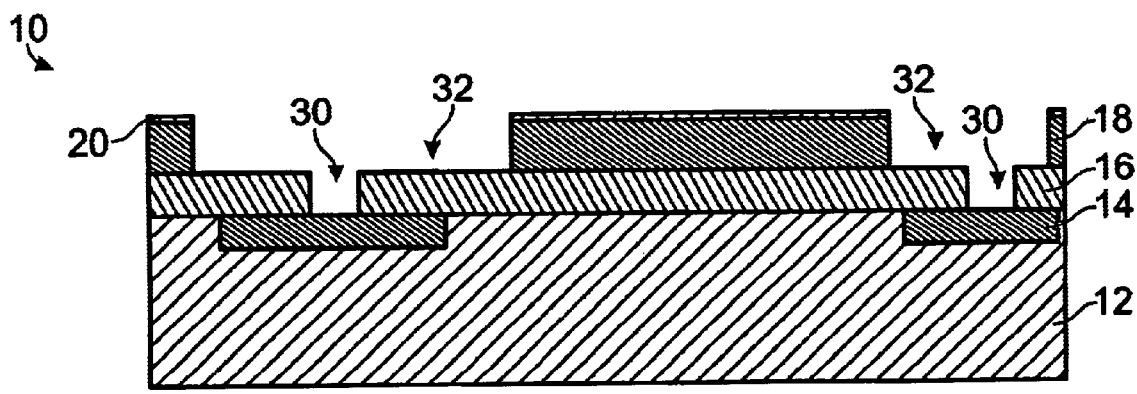
FIG. 8 is a cross sectional view showing a trench formed in the sacrificial layer and via through an underlying oxide layer.

Referring now to FIG. 8, the first hard mask 20 is used to etch the first sacrificial layer 18 to form a trench 32. The first insulator layer 16 is etched extending the via 30 until it reaches the device regions 14, or other underlying metal layers. In another embodiment, the first sacrificial layer 18 acts as a mask while the silicon dioxide is etched, for example a plasma contain $C_3F_8$ and Argon could be used. Other etch chemistries are also available to etch silicon dioxide without etching the first sacrificial layer. Then the first sacrificial layer 18 is selectively etched, preferably using a plasma comprising oxygen if Unity™ sacrificial polymer is used as the first sacrificial layer, to form the trench 32. Regardless of the etch sequence or process used, the resulting structure is shown in FIG. 8, wherein trenches and vias have been formed.

Figure 9:
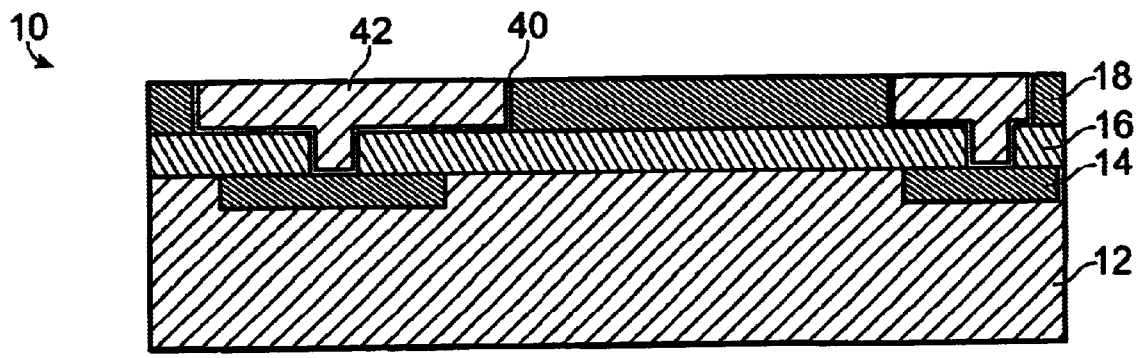
FIG. 9 is a cross sectional view following deposition of barrier metal and interconnects.

Referring now to FIG. 9, barrier metal 40 and copper 42 are deposited and CMP planarized. The barrier metal may be Ti, TiN, TaN or WN. In one embodiment, the first hard mask 20 is also removed.

In another embodiment, the first insulator layer is also a sacrificial layer, of for example Unity™ sacrificial polymer. A thin layer of oxide is deposited and CMP planarized. An initial sacrificial layer is then deposited. Alternatively, after front-end processing a layer of silicon dioxide between approximately 50 nm and 200 nm is deposited, followed by deposition and CMP planarization of the initial sacrificial layer. A placeholder oxide layer is deposited with a first intra-level sacrificial layer. In one embodiment, following barrier metal and copper deposition, the initial sacrificial layer is interposed between the first copper level and the substrate. Following completion of processing, this will produce an air gap between the first copper level and the substrate.

Figure 10:
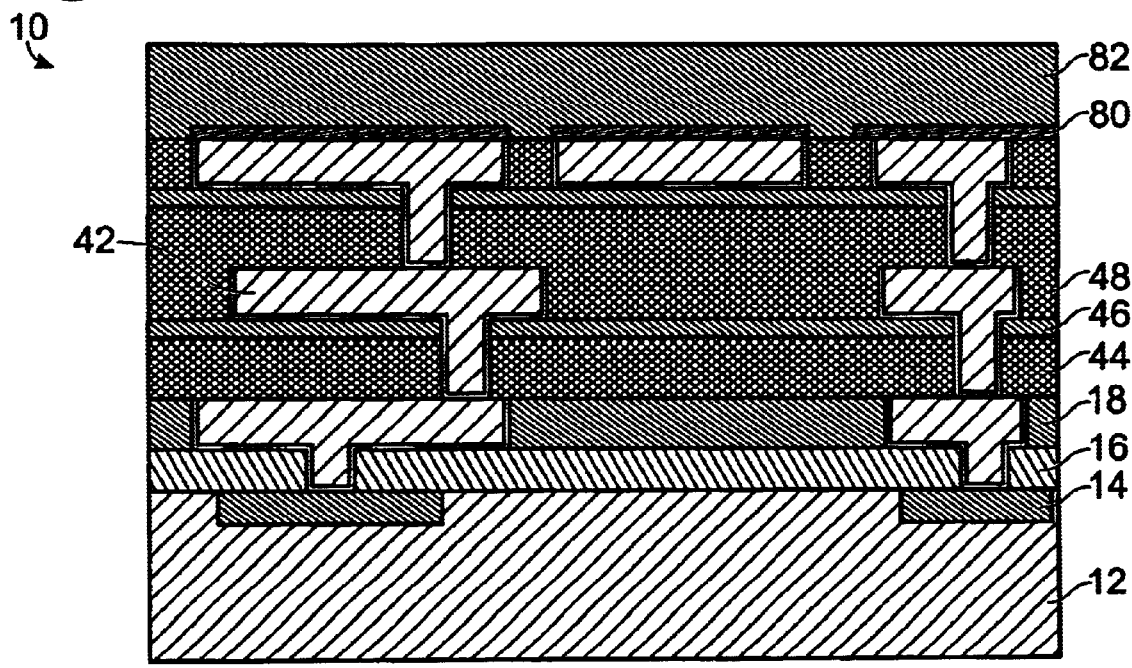
FIG. 10 is a cross sectional view showing three interconnect levels following passivation.
Figure 11:
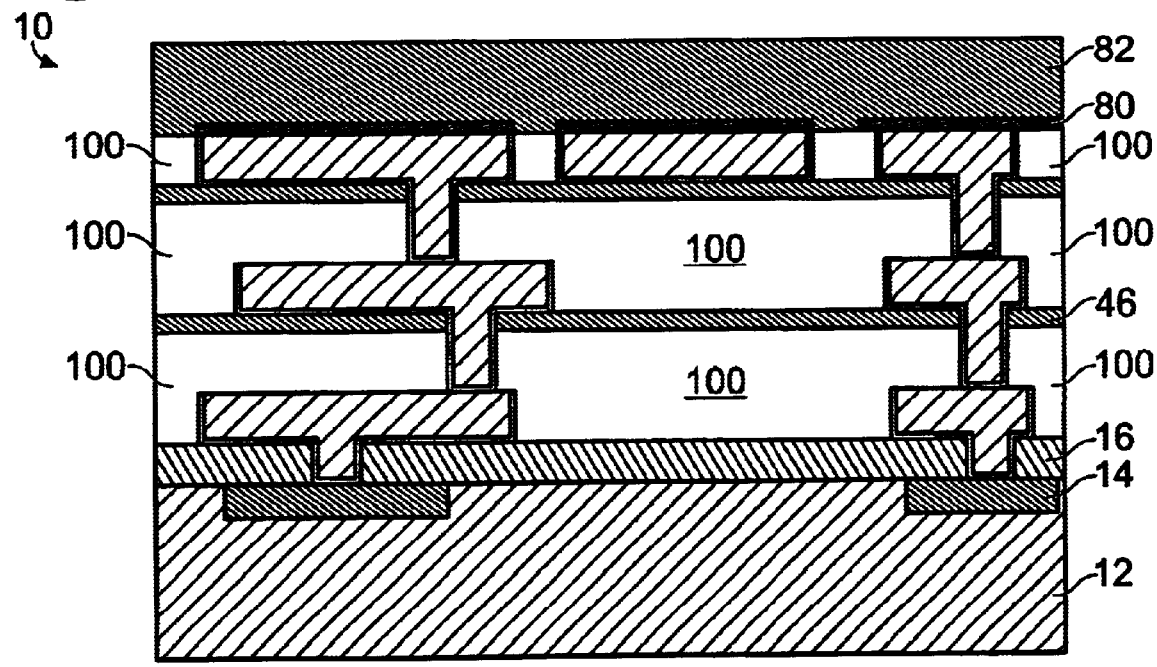
FIG. 11 is a cross sectional view following decomposition of any sacrificial layers to form air gaps between interconnects.

Referring now to FIG. 10, the basic process is repeated to produce multiple interconnect levels. As shown, a second sacrificial layer 44 is deposited to a thickness between approximately 500 nm and 1500 nm. In one embodiment, the second sacrificial layer is Unity™ sacrificial polymer, which is deposited by spin coating. An etch stop layer 46 is deposited over the second sacrificial layer to a thickness of between approximately 50 nm and 100 nm. The etch stop material is preferably silicon dioxide. A third sacrificial layer 48, preferably of the same material as the other sacrificial layers although not necessarily the same material, is deposited to a thickness of between approximately 500 nm and 800 nm. If Unity™ sacrificial polymer is used, the interlevel structure 10 is preferably heated to approximately 120° C. for approximately 3 minutes to soft cure the Unity™ sacrificial polymer. A double hard mask is then formed overlying the third sacrificial layer 48.

Repeating the steps of depositing additional sacrificial layers, etch stops, and hard masks, followed by patterning and selective etching as described above can be used to form additional interconnect levels. As shown in FIG. 10, a total of three interconnect levels have been formed. Additional levels are also possible, by repeating the process. Once the final interconnect level is completed, a capping layer 80 of silicon nitride or boron nitride is deposited to a thickness of approximately between 5 nm and 10 nm and patterned, preferably using photoresist, to protect the top copper layer. This capping layer is preferably slightly larger than the trench of the top metal lines, but it is not very dimensionally critical. Any remaining photoresist is then stripped. A passivation layer 82, preferably of oxide, is deposited to a thickness of between approximately 500 nm and 1500 nm.

Referring now to FIG. 12, all of the sacrificial layers are decomposed to produce the interconnect structure 10 having air gaps 100 which serve as intra-level insulators and inter-level insulators. In the embodiment where Unity™ sacrificial polymer is used, the interconnect structure 10 is preferably annealed in a nitrogen purged furnace at a temperature between approximately 425° C. and 500° C. to decompose the Unity™ sacrificial polymer and allow it to permeate through any overlying oxide.

Following processing as described above, air gaps are formed as both inter-level insulators and intra-level insulators, therefore, the effective dielectric constant shall be very close to 1 when the etch stop/placeholder silicon oxide is very thin. For an integrated circuit with very large number of interconnect layers the thickness of the etch stop/placeholder oxide may have to be increase to enhance the mechanical strength. This will increase the effective dielectric constant of the system. The surface of the top layer copper is protected with nitride. There is no direct silicon oxide to copper contact. Therefore, there is no copper diffusion problem. The leakage current between adjacent copper lines and that between copper layers is expected to be very small. The illustration sketches showed two stacks of contact. The left-hand side intended to be a normal interconnects. The right hand side stack is to illustrate the edge shielding which is need for mechanical support of the etch stop/placeholder oxide layer and copper lines. In one embodiment, the edge shielding is distributed around the perimeter of the device to provide additional mechanical support. In another embodiment, the edge shielding is also provided at key points throughout the chip area. The edge shielding can be used as one of the power supply bus lines or ground lines.

The etch stop/placeholder silicon oxide is adhered to the metal lines through the barrier metal. Therefore, the good adhesion between barrier metal and copper and barrier metal to etch stop/placeholder oxide is preferred.

Although preferred embodiments along with some alternatives have been described, the invention is not limited to any specific embodiment. Rather, the scope of the invention is determined by the following claims and their equivalents.

What is claimed is:

1. A method making dual damascene structures comprising the steps of:
    a) forming a sacrificial layer comprising a sacrificial polymer over an oxide layer;
    b) depositing a first hard mask at a temperature below 400 degrees Celsius over the sacrificial layer;
    c) depositing as a second hard mask at a temperature below 400 degrees Celsius over the first hard mask;
    d) depositing and patterning a photoresist via pattern;
    e) etching the second hard mask to form a via in the second hard mask;
    f) etching the first hard mask to extend the via through the first hard mask;
    g) depositing and patterning a photoresist line pattern;
    h) etching the second hard mask to form a line in the second hard mask;
    i) etching the sacrificial layer using the first hard mask as a via mask, whereby the via extends through the sacrificial layer;
    j) etching the first hard mask using the second hard mask as a line mask, whereby the line extends through the first hard mask; and
    k) etching off the second hard mask and etching into the oxide layer.

2. The method of claim 1, wherein the step of forming the sacrificial layer further comprises spin coating.

3. The method of claim 1, wherein the sacrificial polymer comprises a copolymer of butylnorbornene and triethoxysilyl norbornene.

4. The method of claim 1, wherein the sacrificial polymer comprises a copolymer of butylnorbornene and triethoxysilyl norbornene dissolved as a 6–12 wt % solution in mesitylene.

5. The method of claim 1, wherein the sacrificial polymer comprises Unity™ sacrificial polymer.

6. The method of claim 1, wherein the sacrificial polymer comprises Unity™ sacrificial polymer dissolved as a 6–12 wt % solution in mesitylene.

7. The method of claim 1, wherein the step of forming the sacrificial layer comprises spin coating a sacrificial polymer, heating the sacrificial polymer to a temperature in the range of between approximately 95 C and 120 C for approximately 3 to 5 minutes, and curing the sacrificial polymer under vacuum or nitrogen ambient at a temperature between approximately 200 C and 250 C for approximately 1 to 2 hours.

8. The method of claim 1, wherein the first hard mask is a low temperature TEOS oxide, and the step of depositing is performed at a temperature below approximately 400 C.

9. The method of claim 1, wherein the first hard mask is a metal film.

10. The method of claim 9, wherein the metal film is TiN, TaN, Ti, Ta, or AlCu.

11. The method of claim 9, wherein the metal film is a TiN film deposited by sputtering at a temperature below approximately 400 C to a thickness of between approximately 50 and 100 nm.

12. The method of claim 11, wherein the step of etching the first hard mask to form a via in the first hard mask is accomplished using a $Cl_2/BCl_3$ plasma etch.

13. The method of claim 1, wherein the second hard mask is a low temperature TEOS oxide, and the step of depositing is performed at a temperature below approximately 400 C.

14. The method of claim 13, wherein the step of etching hard mask to form a via in the second hard mask is accomplished using a $C_2F_6/O_2$ plasma etch.

15. The method of claim 1, wherein the second hard mask is a metal film selected from the group consisting of TiN, TaN, Ti, Ta, or AlCu.

16. The method of claim 1, wherein the step of etching the sacrificial layer is accomplished using a $Ar/O_2$ plasma etch.

17. The method of claim 1, further comprising
    l) depositing a barrier metal and copper; and
    m) planarizing the barrier metal and copper to form a metal layer.

18. The method of claim 17, further comprising decomposing the first sacrificial layer, whereby the first sacrificial layer is replaced by air gaps.

* * * * *